United States Patent [19]
Morris et al.

[11] Patent Number: 6,104,602
[45] Date of Patent: Aug. 15, 2000

[54] COMPACT ELECTRICAL EQUIPMENT ENCLOSURE

[75] Inventors: Robert A. Morris, Burlington; Charles S. Pitzen, Farmington; Charles R. Bruce, Danbury; Michael C. von Kannewurff, Middlebury, all of Conn.

[73] Assignee: General Electric Company, Schenectady, N.Y.

[21] Appl. No.: 08/904,293

[22] Filed: Jul. 31, 1997

[51] Int. Cl.[7] ................................................ H05K 7/20
[52] U.S. Cl. ..................... 361/678; 361/683; 361/692; 361/707; 361/710; 361/704; 361/717; 165/80.3; 165/185; 174/16.3; 174/252
[58] Field of Search .................... 361/683–723, 361/802, 744, 816; 323/322, 319, 910, 902; 165/80.3, 185, 104.33, 104.34, 80.4, 165, 104.32, 80.2; 174/6.3, 16.3, 52.1, 52.4

[56] References Cited

U.S. PATENT DOCUMENTS

| 2,471,011 | 5/1949 | Shapiro | 175/363 |
| --- | --- | --- | --- |
| 4,520,425 | 5/1985 | Ito | 361/697 |
| 4,535,386 | 8/1985 | Frey et al. | 361/389 |
| 4,620,263 | 10/1986 | Ito | 361/383 |
| 4,683,517 | 7/1987 | Yazvac | 361/358 |
| 4,845,380 | 7/1989 | Piegari | 307/149 |
| 5,105,336 | 4/1992 | Jacoby et al. | 361/383 |
| 5,151,842 | 9/1992 | DeBiasi et al. | 361/93 |
| 5,243,493 | 9/1993 | Jeng et al. | 361/690 |
| 5,341,080 | 8/1994 | Sanz | 318/778 |
| 5,424,911 | 6/1995 | Joyner et al. | 361/616 |
| 5,513,071 | 4/1996 | LaViolette et al. | 361/703 |
| 5,670,936 | 9/1997 | Estes et al. | 340/501 |

*Primary Examiner*—Leo P. Picard
*Assistant Examiner*—Michael Datskovsky
*Attorney, Agent, or Firm*—Cantor Colburn LLP; Damian G. Wasserbauer; Carl B. Horton

[57] ABSTRACT

A motor control compartment provides an air flow chamber at the rear thereof and mounts the solid state switches on heat sinks that are positioned in the air flow. An apertured support plate separates the interior of the compartment from the air flow chamber and allows additional space for supplemental control equipment.

16 Claims, 4 Drawing Sheets

COMPACT ELECTRICAL EQUIPMENT ENCLOSURE

BACKGROUND OF THE INVENTION

Electrical equipment enclosures such as those described within U.S. Pat. No. 4,683,517 entitled "Integrated Lighting Panelboard and Wiring Gutter Assembly" which contain electrical switches are often custom assembled at the point of manufacture to accommodate the size and number of switches contained therein.

U.S. Pat. No. 5,151,842 entitled "Switchboards and Panelboards Having Interlock and Load Selection Capabilities" describes such enclosures when used to contain electronic circuit breakers and the like.

A more recent example of an electrical equipment enclosure is found within U.S. Pat. No. 5,424,911 entitled "Compact Motor Controller Assembly". This patent describes motor starters and contactors used to efficiently start and stop industrial rated electric motors. One such motor starter is found within U.S. Pat. No. 5,341,080 entitled "Apparatus and Three Phase Induction Motor Starting and Stopping Control Method".

In such state-of-the-art motor control devices, solid state switches such as SCRs for example, are often employed to controllably switch the motor current to provide smooth motor starting and stopping function. Since the SCRs become heated upon current transfer therethrough, heat sinks in the form of large metal blocks of copper, aluminum and their alloys are required to protect the SCRs from overheating.

Other types of electrical control equipment, such as relays, contactors, control power transformers and the like are often required within the motor control compartment, the motor compartment is oversized to accommodate the heat sinks.

One purpose of the invention is to provide a modular motor control compartment that provides a separate controlled air-flow compartment for the heat sink to free-up the area within the compartment adjacent the motor control unit to facilitate space as well as to accommodate electrical connection with the motor controller unit.

SUMMARY OF THE INVENTION

A motor control compartment provides an air flow chamber at the rear thereof and mounts the solid state switches on heat sinks that are positioned in the air flow. A support plate separates the interior of the compartment from the air flow chamber and allows additional space for supplemental control equipment. Additional space is thus acquired within the compartment for supplemental electrical control equipment. Placement of the supplemental control equipment on the support plate provides conduction cooling to the supplemental control equipment as well.

DESCRIPTION OF THE PREFERRED EMBODIMENT

Figure 1:
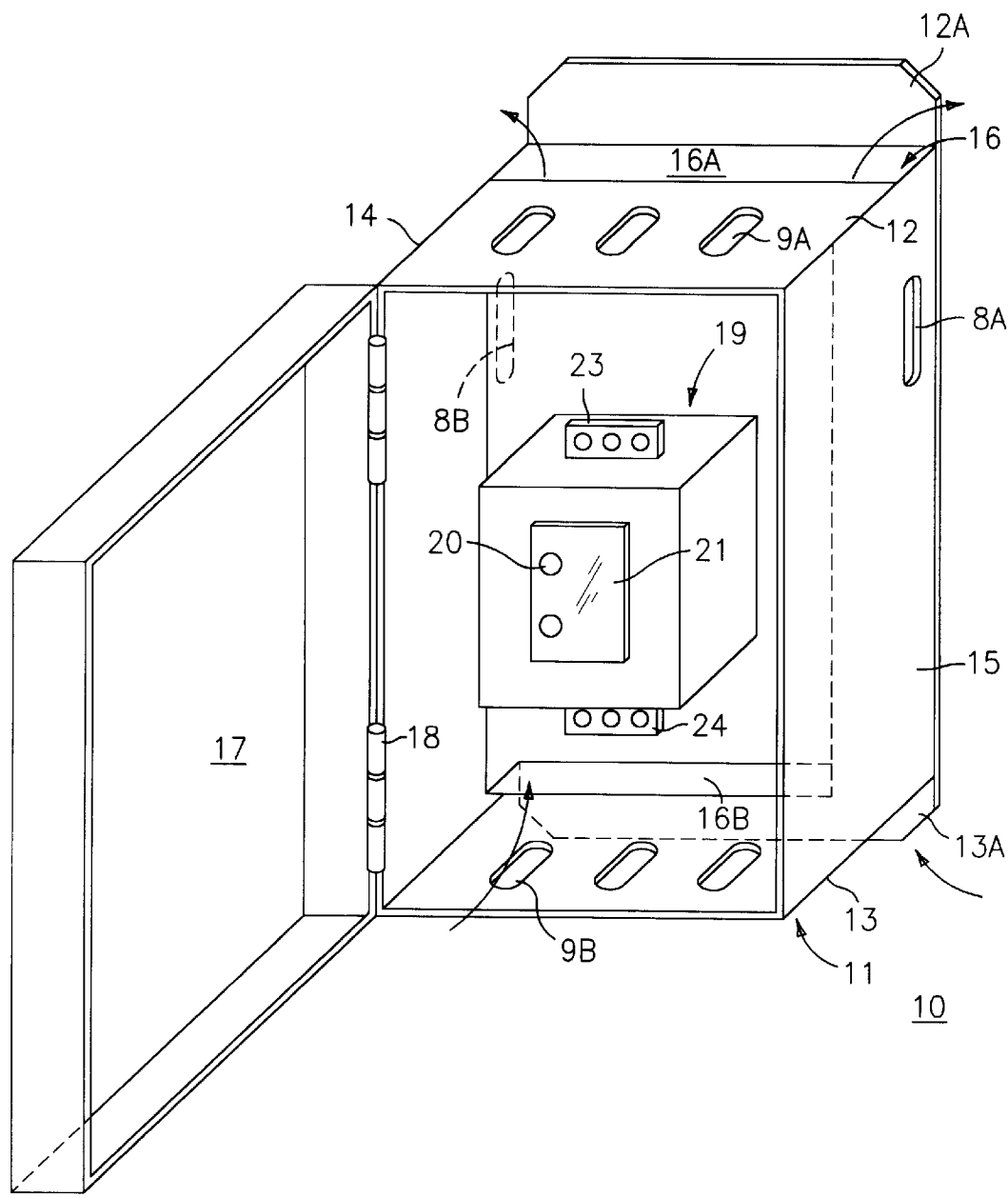
FIG. 1 is a front perspective view of a compact electrical equipment compartment according to the invention.

A motor control compartment 10 is shown in FIG. 1 and includes a metal enclosure 11 that includes a top 12, bottom 13 and opposing sidewalls 14, 15. An air channel 16 is provided in the rear of the enclosure and continues from the top slot 16A to the bottom slot 16B, as indicated and includes side vents 8A, 8B for added ventilation efficiency and to allow inspection. The top and bottom slots are usually covered with a wire mesh (not shown) to prevent egress of dust and materials within the air channel. The compartment is wall-mounted by means of the top and bottom flanges 12A, 13A respectively. Cable access knockouts 9A, 9B are provided on the top and bottom 12, 13 for receiving the load and line cables (not shown) which connect with the corresponding line and load terminals arranged on the top and bottom of the motor starter unit 19. The motor starter unit is similar to that described within the aforementioned U.S. Pat. No. 5,341,080 and includes switches 20 within the transparent faceplate 21 for setting the motor operating characteristics. Access to the associated motor (not shown) is deterred by means of the door 17 mounted to the sidewall 14 by means of hinges 18, as indicated.

Figure 2:
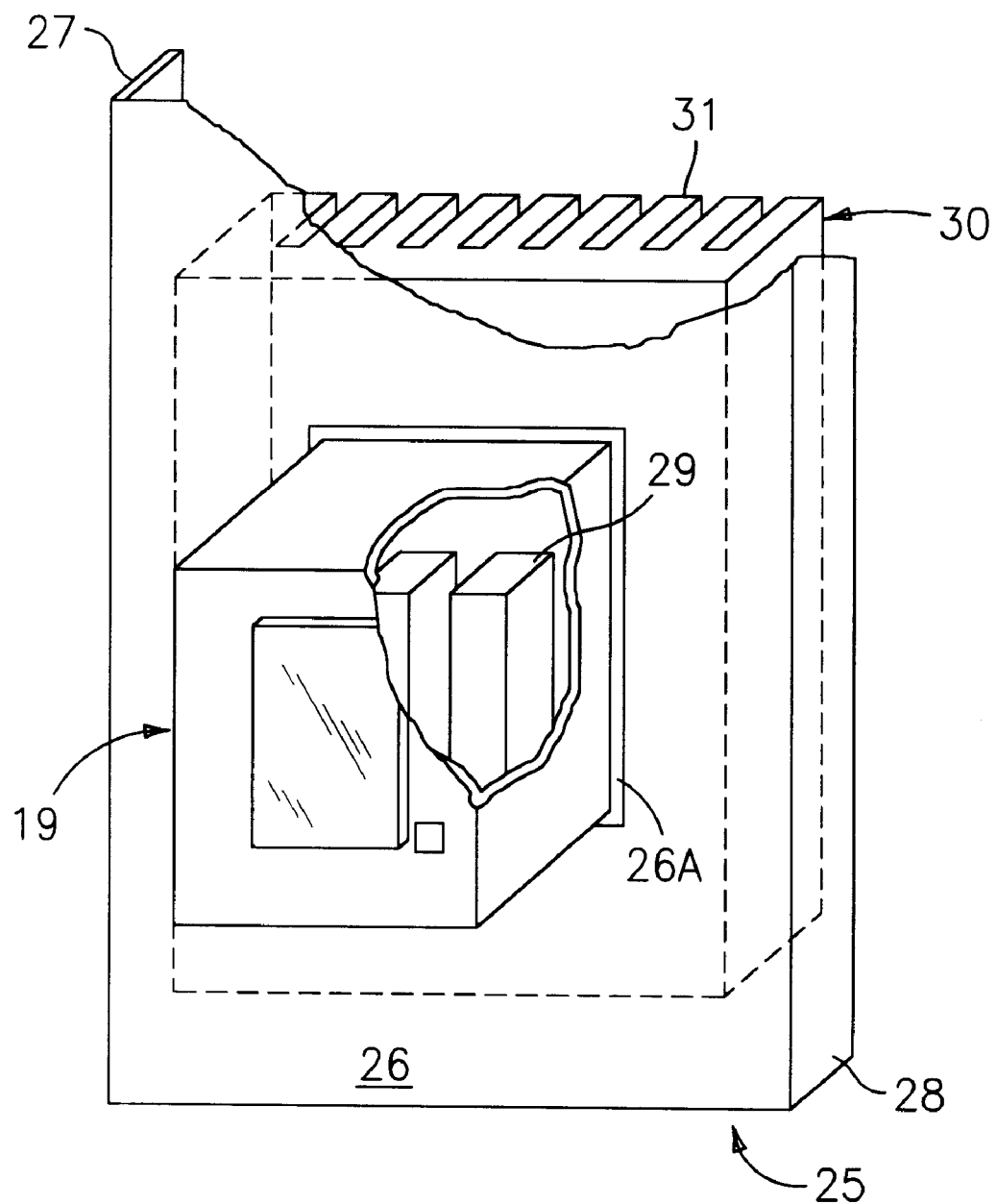
FIG. 2 is a top perspective view of a motor control unit mounted on a support shelf and arranged on top of a heat sink.

The floor support 25 is shown in FIG. 2 to consist of a rectangular plate that is folded to define a front wall 26 with a pair of opposing sidewalls 27, 28 for added rigidity. The plate can be fabricated from steel or an aluminum alloy with beryllium to provide excellent thermal conductivity along with good structural support. The motor starter unit 19 is first attached to the heat sink 30 and the floor support 25 is positioned thereover by passing the motor starter through the rectangular aperture 26A formed in the front wall. The heat sink is fabricated from a solid aluminum block with a plurality of fins 31 formed therein to present a large specific surface for transfer of heat away from the SCRs 29 contained within the motor starter unit.

Figure 3:
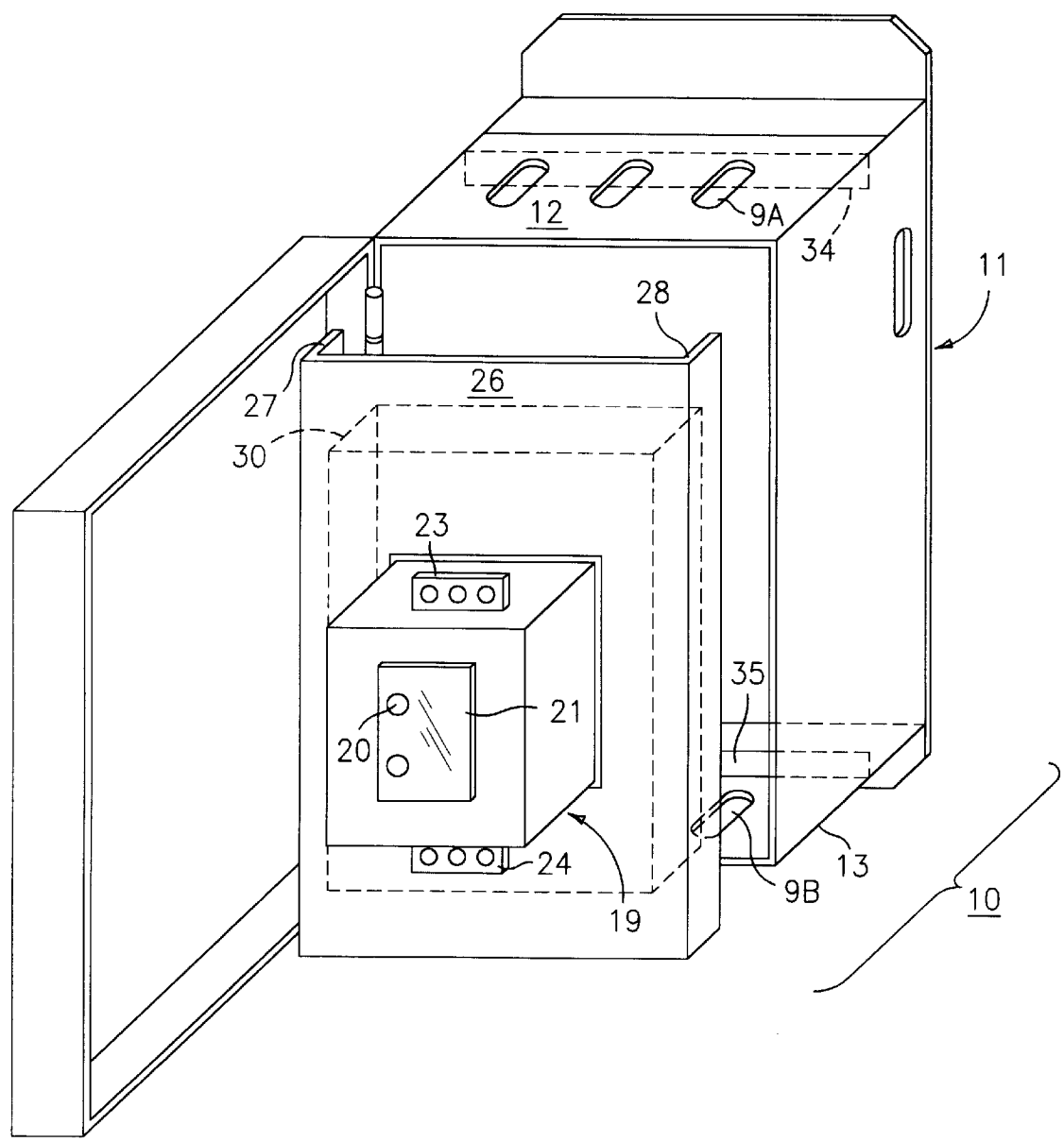
FIG. 3 is a front perspective view of the compact electrical equipment compartment of FIG. 1 with the motor control and support shelf in isometric projection.
Figure 4:
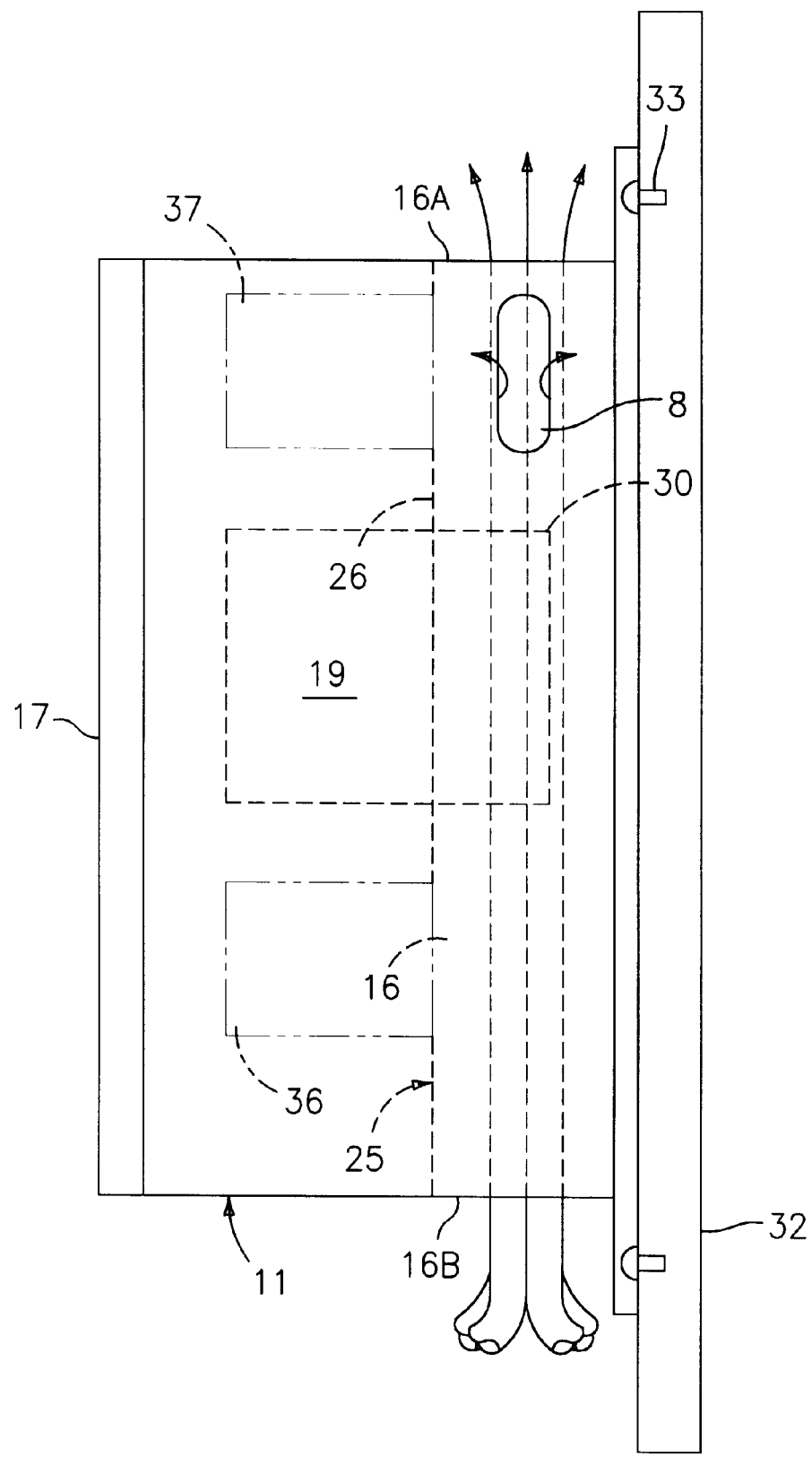
FIG. 4 is a side plan view of the electrical equipment compartment of FIG. 1 attached to a support wall with arrows depicting air current flow.

With the motor starter unit 19 positioned on the floor-support 25, the arrangement is then placed in the enclosure 11 within motor control compartment 10 in the manner shown in FIGS. 3 and 4 wherein the top and bottom tabs 34, 35 extending from the top 12 and bottom 13 abut against the opposite surface of the front wall 26 to accurately position the input and output terminals 23, 24 (shown also in FIG. 1) adjacent the apertures 9A, 9B respectively and position the sidewalls 27, 28 to define the air channel 16 for the heat sink 30 as shown in FIG. 1.

The operation of the cooling efficiency of the enclosure 11 is best seen by now referring to FIG. 4 where the enclosure is shown attached to a support wall 32 by means of screws 33. With the door 17 closed, and the motor starter unit 19 operational, the heat generated within the motor starter unit transfers via the heat sink 30 to the ambient air by virtue of the air flow depicted by arrows from the bottom slot 16B of the air channel 16 out to the top slot 16A as well as out the side vents 8. The positioning of the heat sink 30 in the air flow stream diverts the heat away from the internal components resulting in a measured decrease in the ambient temperature generated therein and, in some applications, allows the substitution of a lower power-rated SCR.

It is noted that additional electrical control equipment can also be included within the interior of the enclosure 11 along with the motor starter unit 19 such as the circuit breaker 36 and overload relay 37, as indicated in phantom. The mounting of the additional control equipment directly onto the surface of the front wall 26 of the floor support 25 allows the heat generated within the additional control equipment to exit through the support out to the air channel 16. In some applications, the provision of the perforated metal screens (not shown) insure that insects and air-borne debris do not enter the air channel along with the cooling air.

A modular electrical equipment enclosure having a defined air flow channel has herein been described. The provision of large heat sinks outside the interior of the enclosure within the defined air channel is found to allow additional electrical equipment to be contained within the enclosure without requiring a larger geometry or forced air cooling by means of circulatory fans.

What is claimed is:

1. An electrical enclosure comprising:

a top plate and a bottom plate joined by a pair of opposing side walls, said top plate and said bottom plate each having disposed therein at least one unobstructed aperture;

a door hingeably attached to one of said pair of side walls for permitting access to an interior defined by said top plate and said bottom plate and said opposing side walls;

an apertured plate intermediate said opposing side walls and positioned within said interior to divide said electrical enclosure into a first side and a second side, a passage on the first side thereof, the passage having a top slot generally parallel with said top plate and a bottom slot generally parallel to said bottom plate; and an electrical device positioned on the second side, said electrical device being in thermal communication with a heat sink positioned within said passage, wherein said at least one unobstructed aperture in each top plate and bottom plate is located on said second side.

2. The enclosure of claim 1 further including an opening on one of said sidewalls, said opening providing access to said air passage for passage of cooling air.

3. The enclosure of claim 1 wherein said electrical device is attached to said heat sink and said heat sink extends through said apertured plate.

4. The enclosure of claim 1 wherein said electrical device includes an SCR.

5. The enclosure of claim 4 wherein said SCR is arranged in abutment with said heat sink.

6. The enclosure of claim 5 wherein said heat sink comprises steel.

7. The enclosure of claim 5 wherein said heat sink comprises aluminum.

8. The enclosure of claim 6 wherein said heat sink includes a plurality of cooling fins.

9. The enclosure of claim 1 wherein said electrical device comprises a motor starter.

10. The enclosure of claim 1 wherein said electrical device comprises a motor contactor.

11. The enclosure of claim 8 further including a circuit breaker mounted on said apertured plate.

12. The enclosure of claim 1 wherein said door, said top and bottom plates and said sidewalls comprise metal.

13. A motor control unit comprising:

an enclosure having a top plate and a bottom plate joined by a pair of opposing side walls, said top plate and said bottom plate each having disposed therein at least one unobstructed aperture;

a door arranged on one of said side walls on said enclosure for permitting access to an interior of said enclosure;

an apertured plate arranged within said enclosure intermediate a front of said enclosure and a rear of said enclosure thereby defining a passage between said apertured plate and said rear of said enclosure, the passage having a top slot generally parallel to said top plate and a bottom slot generally parallel to said bottom plate; and a motor starter attached to a heat sink, said motor starter arranged on a side of said apertured plate facing said front of said enclosure and said heat sink arranged on an opposite side of said apertured plate wherein said heat sink extends within said passage and wherein said at least one unobstructed aperture in each top plate and bottom plate is located intermediate said front of said enclosure and said apertured plate.

14. The motor control unit of claim 13 further including an opening within one of said sidewalls, said opening providing air transport between an exterior of said one of said sidewalls and said air passage.

15. An electrical enclosure of claim 1 further comprises:

a back plate joined by said pair of opposing walls;

wherein said aperture plate, said opposing side walls, and said back plate further define a channel for air flow.

16. A motor control unit comprising:

an enclosure having a top plate and a bottom plate joined by a pair of opposing side walls, said top plate and said bottom plate each having disposed therein at least one unobstructed aperture;

a door arranged on one of said side walls on said enclosure for permitting access to an interior of said enclosure;

an apertured plate arranged within said enclosure intermediate a front of said enclosure and a rear of said enclosure thereby defining a passage between said apertured plate and said rear of said enclosure, said passage having a top slot generally parallel to said top plate and a bottom slot generally parallel to said bottom plate;

a motor starter attached to a heat sink, said motor starter arranged on a side of said apertured plate facing said front of said enclosure and said heat sink arranged on an opposite side of said apertured plate wherein said heat sink extends within said passage and wherein said at least one unobstructed aperture in each top plate and bottom plate is located intermediate said front of said enclosure and said apertured plate; and an opening within one of said side walls, said opening providing air transport between said passage and an exterior of said one of said side walls.

* * * * *